United States Patent [19]
Lampe, Jr. et al.

[11] Patent Number: 5,933,949
[45] Date of Patent: Aug. 10, 1999

[54] SURFACE MOUNT DEVICE TERMINAL FORMING APPARATUS AND METHOD

[75] Inventors: Ross Warren Lampe, Jr., Raleigh; Gerard James Hayes, Wake Forest, both of N.C.

[73] Assignee: Ericsson Inc., Research Triangle Park, N.C.

[21] Appl. No.: 08/812,785

[22] Filed: Mar. 6, 1997

[51] Int. Cl.⁶ .................................................. H01K 3/10
[52] U.S. Cl. ......................... 29/854; 29/564.2; 29/564.6; 29/596
[58] Field of Search ................................. 29/882, 564.2, 29/564.6, 596

[56] References Cited

U.S. PATENT DOCUMENTS

| | | |
|---|---|---|
| 2,298,275 | 10/1942 | Bohren . |
| 3,196,523 | 7/1965 | Bell . |
| 3,259,862 | 7/1966 | Richard . |
| 3,323,200 | 6/1967 | McKeon . |
| 3,367,816 | 2/1968 | Mills . |
| 3,576,063 | 4/1971 | Bakermans ............................ 29/882 X |
| 3,609,833 | 10/1971 | Fry . |
| 3,659,336 | 5/1972 | Horne . |
| 3,670,496 | 6/1972 | Weber . |
| 3,684,993 | 8/1972 | Hazen, III et al. . |
| 3,689,981 | 9/1972 | La Valle . |
| 3,811,045 | 5/1974 | Turner . |
| 4,354,310 | 10/1982 | Hatton .................................. 29/882 X |
| 4,516,103 | 5/1985 | Arnold . |
| 4,621,251 | 11/1986 | Keefe . |
| 4,696,100 | 9/1987 | Yamamoto . |
| 4,785,527 | 11/1988 | Bernard . |
| 5,191,701 | 3/1993 | Espenhain . |
| 5,262,745 | 11/1993 | Gutierrez . |
| 5,351,167 | 9/1994 | Wai et al. . |
| 5,446,958 | 9/1995 | Hoang .................................. 29/882 X |
| 5,572,788 | 11/1996 | Saitoh . |
| 5,692,290 | 12/1997 | Mamada . |

FOREIGN PATENT DOCUMENTS

| | | |
|---|---|---|
| 20 55 285 | 5/1972 | Germany . |
| 30 42 433 | 7/1982 | Germany . |
| 2-271511 | 11/1990 | Japan . |
| 2-290006 | 11/1990 | Japan . |

OTHER PUBLICATIONS

Patent Abstracts of Japan, vol. 007, No. 065 (E–165), Mar. 18, 1983 & JP 57–211712 A (Matsushita Denki Sangyo KK), Dec. 25, 1982, see abstract.

Patent Abstracts of Japan, vol. 007, No. 170 (E–189), Jul. 27, 1983 & JP 58–075825 A (Murata Seisakusho:KK), May 7, 1983, see abstract.

ATT Technologies, *Technical Digest*, No. 76, Mar. 1985, F. T. Dickens and R. A. Frantz, Jr., pp. 19 and 20.

*Primary Examiner*—Carl J. Arbes
*Attorney, Agent, or Firm*—Nixon & Vanderhye P.C.

[57] ABSTRACT

Terminals for a surface mount device are crimped about the device core in a staple-like manner, utilizing spooled wire as the terminal filament. The spooled wire is supported above the core material in a mechanical platform, and first and second slide assemblies shape the conductive filament about the upper perimeter of the core material and the underside of the core material, respectively. The simplified process reduces manufacturing time and costs.

26 Claims, 5 Drawing Sheets

SURFACE MOUNT DEVICE TERMINAL FORMING APPARATUS AND METHOD

BACKGROUND OF THE INVENTION

The present invention relates to an apparatus and method for forming terminals on a core of a surface mount device and, in particular, to an apparatus and method for crimping terminals on a surface mount device core.

Driven by the increased demand for high-speed manufacturing, surface mount components have become key elements in electronics manufacturing. Currently, billions of surface mount components are used yearly.

The most common surface mount components are two-terminal devices, such as resistors, capacitors, inductors, fuses, diodes, etc. The terminals of these devices usually consist of a metal plating secured to the core material (which is typically a ceramic or thermoset plastic material). In addition to being process intensive (usually requiring heat treatment), the metallization process for forming these terminals requires the application of additional materials, such as adhesives and solder pastes, over very small surface areas. The increased difficulty in manufacturing is reflected in the manufacturing cost of the component. Moreover, the metallization process of ceramic materials can be difficult to control over small surface areas. An example of a typical surface mount component with metallized terminals is illustrated in FIG. 1.

An adhesive coating (typically a UV cured, visible or heat cured plastic) is commonly added to many surface mountable devices in order to secure connections and to provide a smooth, uniform surface for automated placement devices. Since the coating material can run over the edges of the device, an external mold may be required to provide the uniform surface.

SUMMARY OF THE INVENTION

In accordance with the present invention, an apparatus and method are provided for forming staple-like terminals on a surface mount component. Unlike previous methods, the invention does not require extensive processing or extraneous materials for processing. The only material required is a conductive filament, and easily processed spooled wire can be used. The structure according to the invention also obviates problems associated with adding an adhesive coating or the like to the surface mount device in that the staple configuration provides an ideal "well" on the top of the device. Once deposited between the staples, the coating material disperses to form a uniform, consistent surface. As a result, an external mold is not required to form the uniform surface area for automated placement machines.

In accordance with one exemplary aspect of the invention, there is provided an apparatus for forming terminals on a core of a surface mount device. The apparatus includes a mechanical platform supporting a core material in a core feeding direction. The mechanical platform includes an opening adapted to receive a conductive filament adjacent the core material in a direction substantially perpendicular to the core feeding direction. A first slide assembly is coupled with the mechanical platform and is displaceable between a retracted position spaced from the core material and an extended position surrounding the core material. A second slide assembly is coupled with the mechanical platform and is displaceable between the retracted position spaced from the core material and an extended position engaging the core material.

The first slide assembly preferably includes a plurality of plungers displaceable between the retracted position and the extended position, an outermost pair of which being disposed on opposite sides of the core material in the extended position. The plungers may include either air actuated plungers, solenoid actuated plungers or cam actuated plungers. The first slide assembly in the extended position engages the conductive filament and shapes the conductive filament about an upper perimeter of the core material. In particular, an outermost pair of the first slide plungers engage the conductive filament to shape it about the upper perimeter, and a central plunger engages the conductive filament and secures it in place while the outermost pair shape the conductive filament.

The second slide assembly preferably comprises a plurality of plungers displaceable between the retracted position and the extended position. The plurality of plungers engage the core material in the extended position. In this context, the second slide plungers in the extended position engage the conductive filament and shape the conductive filament across an underside of the core material. In particular, the outermost pair engage the conductive filament in the extended position and shape the conductive filament across the underside of the core material, and a central plunger of the second slide plungers engages the conductive filament and tacks the shaped conductive filament against the core material in the extended position.

The apparatus may further include a controller communicating with the first slide assembly and the second slide assembly. The controller controls a position of the first and second slide assemblies in accordance with predetermined operating parameters.

In accordance with another exemplary aspect of the invention, there is provided a method for forming terminals on a core of a surface mount device with a crimping apparatus. The method includes the steps of (a) suspending the core material in the mechanical platform in the core feeding direction, (b) inserting the conductive filament between the core material and the first slide assembly in the opening, the conductive filament being inserted in a direction substantially perpendicular to the core feeding direction, (c) displacing the first slide assembly from the retracted position to the extended position, thereby shaping the conductive filament about an upper perimeter of the core material, and (d) displacing the second slide assembly from the retracted position to the extended position, thereby shaping the conductive filament across an underside of the core material. Step (c) preferably comprises the step of shearing the conductive filament at a predetermined length. Steps (c) and (d) may be performed in succession. Steps (c) and (d) may further be practiced by controlling a position of the first and second slide assemblies with the apparatus controller.

Step (c) may include the step of displacing the outermost pair of plungers from the retracted position to the extended position, and may further include the step of securing the filament adjacent the core material with the first slide central plunger displaced to the extended position. Step (d) may comprise the step of displacing an outermost pair of the second slide plungers from the retracted position to the extended position, and may further include the step of pressing the filament to the underside of the core material with the second slide central plunger displaced to the extended position.

In accordance with yet another exemplary aspect of the invention, there is provided an apparatus for forming terminals on a core of a surface mount device. The apparatus includes structure for supporting a core material in a core feeding direction, the structure adapted to receive a conductive filament disposed adjacent the core material in a direction substantially perpendicular to the core feeding direction. The apparatus also includes a first deflecting device for deflecting the conductive filament about an upper perimeter of the core material and a second deflecting device for deflecting the conductive filament across an underside of the core material. The first deflecting device preferably includes structure for securing the conductive filament while the conductive filament is being deflected about the upper perimeter of the core material. The second deflecting device preferably includes structure for pressing the conductive filament against the underside of the core material. Finally, the apparatus may further include a controller for controlling a position of the first deflecting device and the second deflecting device in accordance with predetermined operating parameters.

BRIEF DESCRIPTION OF THE DRAWINGS

These and other aspects and advantages of the present invention will be described in detail with reference to the accompanying drawings, in which.

DETAILED DESCRIPTION OF PREFERRED EMBODIMENTS

Figure 8:
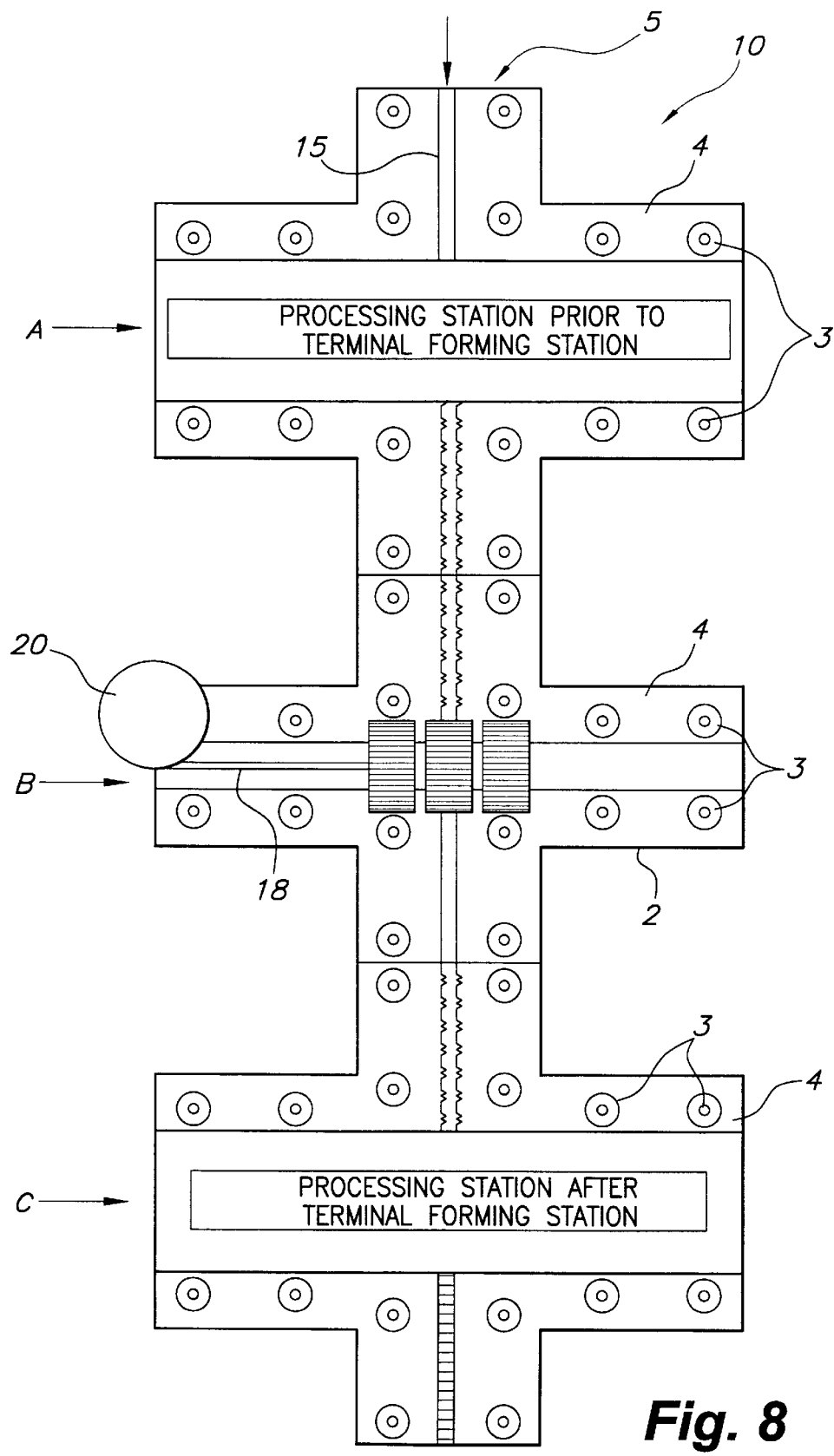
FIG. 8 is a plan view of the mechanical platform supporting the terminal forming apparatus of the invention.

Referring to FIGS. 2–8, the apparatus according to the present invention includes a mechanical platform 10 supporting a first slide assembly (vertical slide assembly in the FIGURES) 12 and a second slide assembly (horizontal slide assembly in the FIGURES) 14. As shown in FIG. 8, the mechanical platform 10 consists of a single platform supporting a plurality of processing stations A, B, C, station B in FIG. 8 being the terminal forming apparatus according to the present invention. The manufacturing platform and a method of constructing wire wound inductors are described in detail in commonly-owned co-pending application Ser. No. 08/995,195, (Attorney Docket the disclosure of which is hereby incorporated by reference. By virtue of the single platform configuration, positioning reference points, e.g. at 2, can be defined enabling consistent automated processing. A single platform configuration aids a sequential, automated manufacturing process if the core material is fed in a continuous manner. If the core is continuous, the spacing between each process can be an integer multiple of the parts made from the core, and there only needs to be a single feed mechanism. Thus, there does not need to be a specific reference point as such, since all parts are moved in unison relative to one another. However, for convenience a reference point can be established anywhere on the platform for mounting a measurement tool to aid in aligning and spacing each process an integer multiple of parts.

Figure 2:
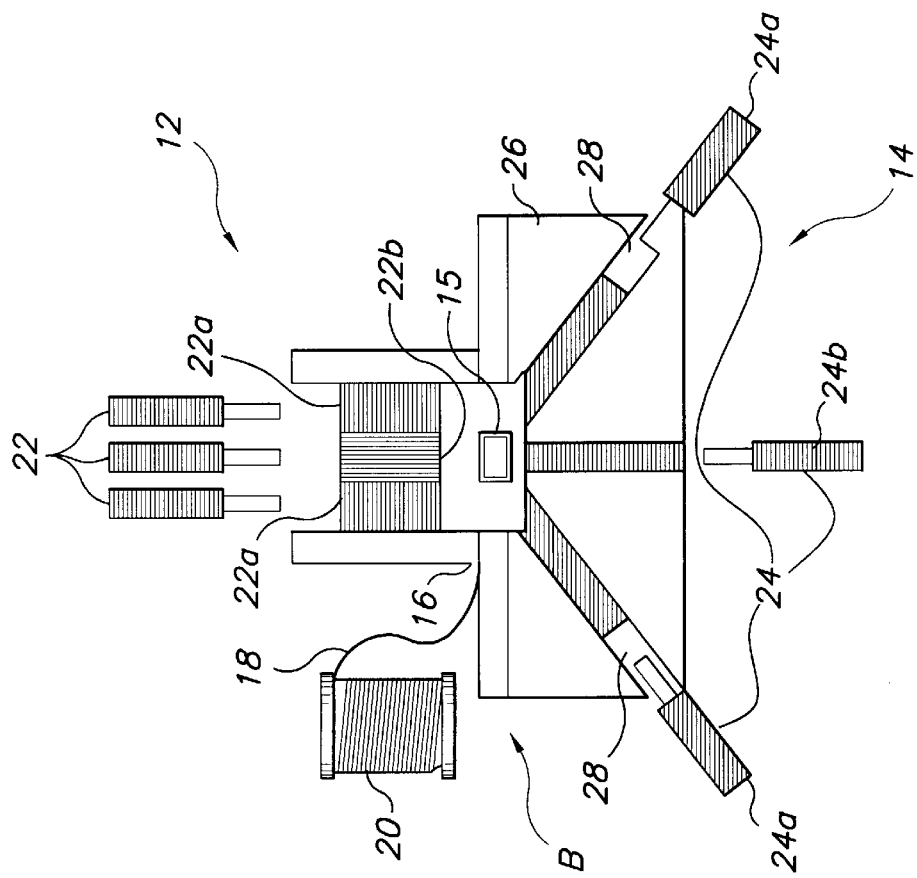
FIG. 2 illustrates the mechanical platform and slide assemblies supporting the core material prior to securing the terminal.

The mechanical platform 10 supports the core material 15 in a feeding direction along the length of the core material 15 (through the page in FIG. 2). The processing stations A, B, C are secured to the platform 1 in any suitable manner and preferably with bolts 3 through supporting plates 4 as shown in FIG. 8. The supporting plates 4 provide a core channel 5, through which the core material travels for processing.

As shown in FIG. 2, the terminal forming station B includes an opening 16 that receives a conductive filament 18 and supports the conductive filament 18 adjacent the core material 15 in a direction substantially perpendicular to the feeding direction. In accordance with the present invention, the conductive filament 18 is preferably drawn from a spool 20 of wire for ease of processing. An example of a suitable conductive filament is spooled 28 AWG tin-coated wire. Spooled 30 AWG wire could also be used for smaller surface mount devices.

Figure 4:
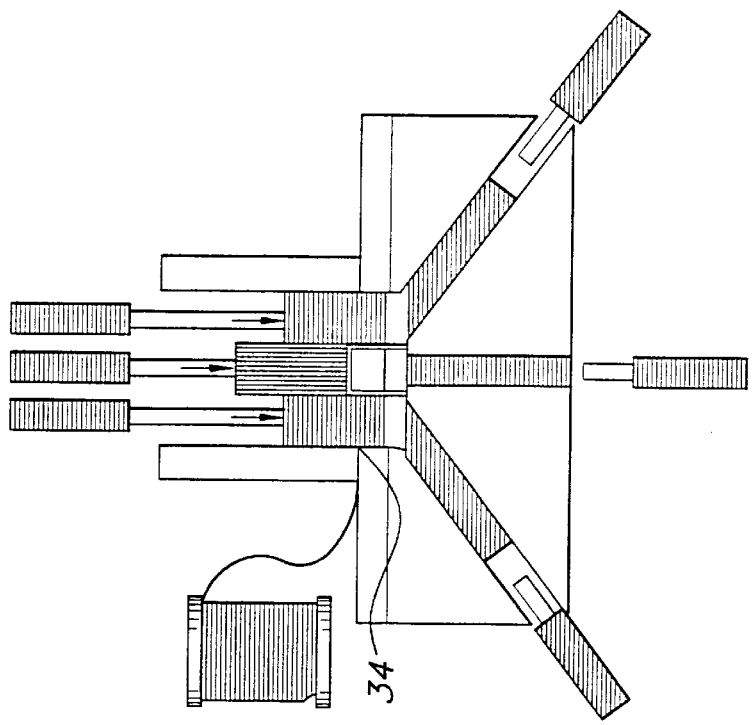
FIG. 4 shows the wire terminal being sheared from the spool and shaped around an upper perimeter of the core material by the first slide assembly.
Figure 7:
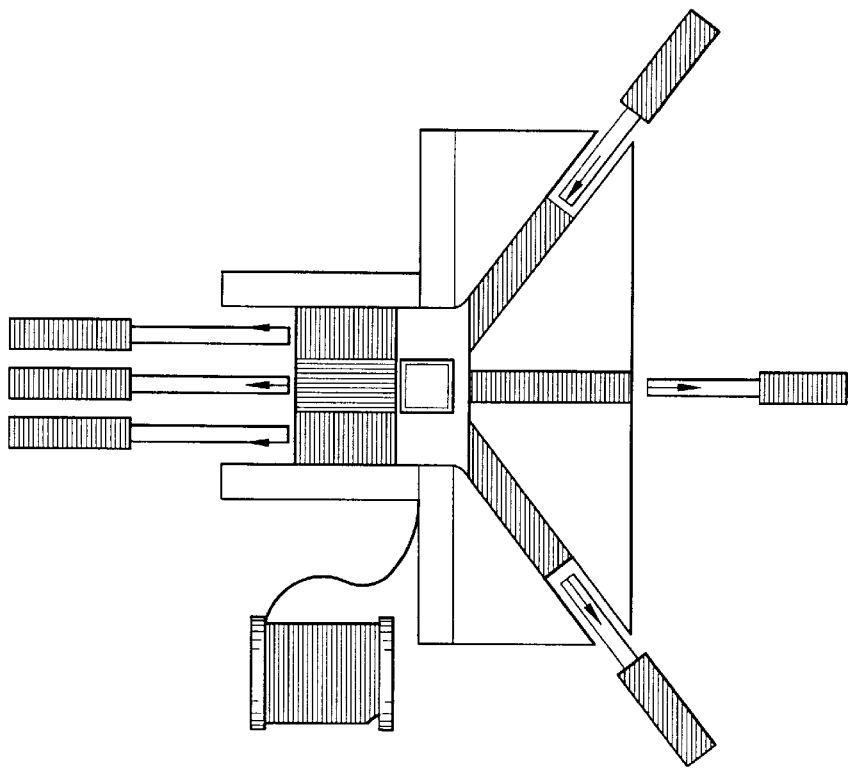
FIG. 7 shows the slides retracted and the core material formed with the staple terminal.

The first slide assembly 12 includes a plurality of air pressure activated plungers 22 positioned such that during processing, the filament 18 forming the terminals is disposed between the plungers 22 and the core material 15. The outermost plungers 22a are extendable between a retracted position spaced from the core material 15 as shown in FIG. 2 and an extended position adjacent the core material as shown in FIG. 4, and the central plunger 22b is extendable between a retracted position spaced from the core material 15 (FIG. 2) and an extended position engaged with the core material 15 (FIG. 4).

Figure 5:
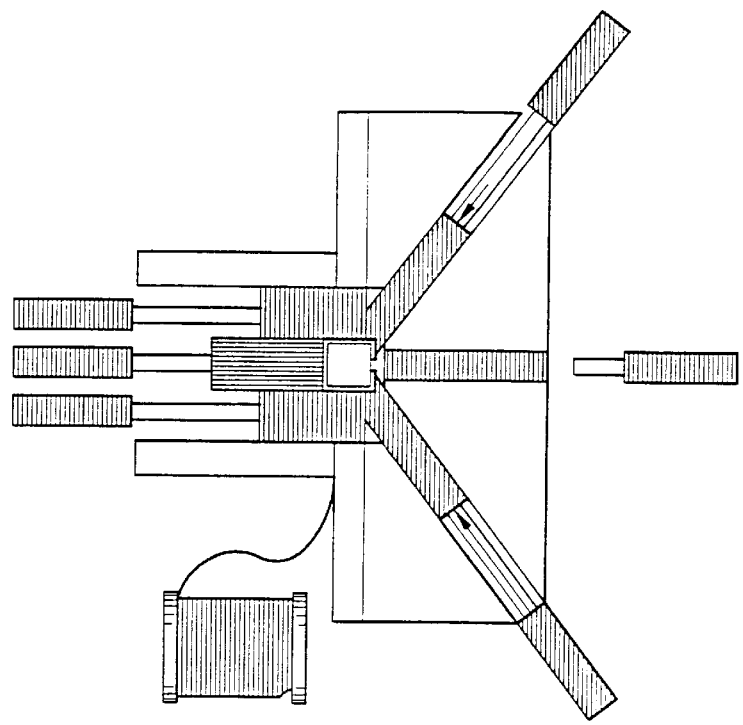
FIG. 5 illustrates the second slide assembly shaping the terminal across the underside of the core material.
Figure 6:
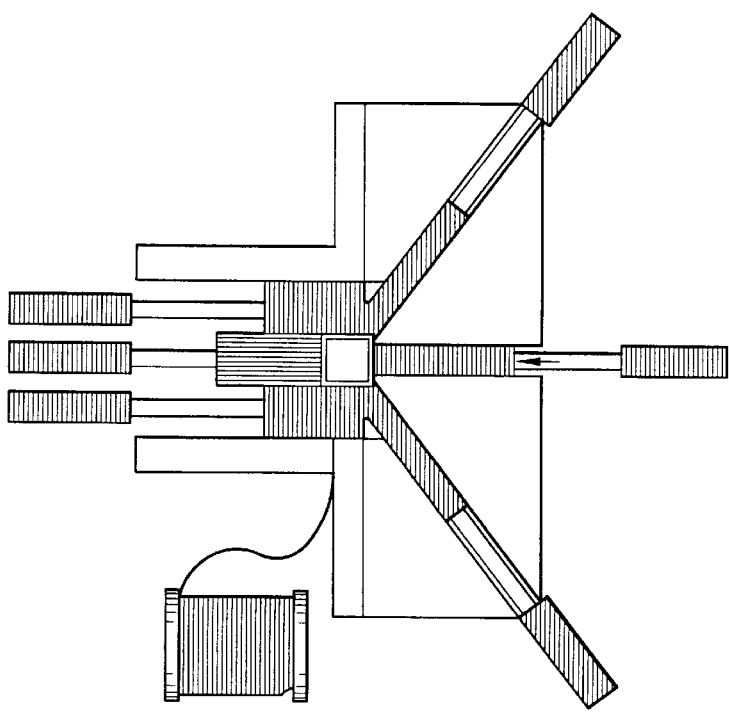
FIG. 6 illustrates the second slide assembly pressing the terminal to the core material.

The second slide assembly 14 includes a plurality of air pressure activated plungers 24 positioned on the opposite side of the core material 15 from the filament 18. The terminal forming station B includes a plunger guide 26 having channels 28 therein that define guide paths for the plungers 24 of the second slide assembly 14. The outermost plungers 24a are displaceable between a retracted position spaced from the core material 15 as shown in FIG. 2 and an extended position engaged with the core material 15 as shown in FIG. 5, and the central plunger 24b is displaceable between a retracted position spaced from the core material 15 (FIG. 2) and an extended position engaged with the core material 15 (FIG. 6).

A controller 30 communicates with the first and second slide assemblies 12, 14 to activate and deactivate the plungers 22, 24 and thereby control the positions of the plungers 22, 24 in accordance with predetermined operating parameters. The controller 30 is preferably a conventional processor such as a PC or the like, and the details thereof will not be further described. In an alternative arrangement, electrically activated solenoids could be used in place of air pressure plungers. In this context, the controller 30 would control the current to the solenoids to effect the process.

Figure 1:
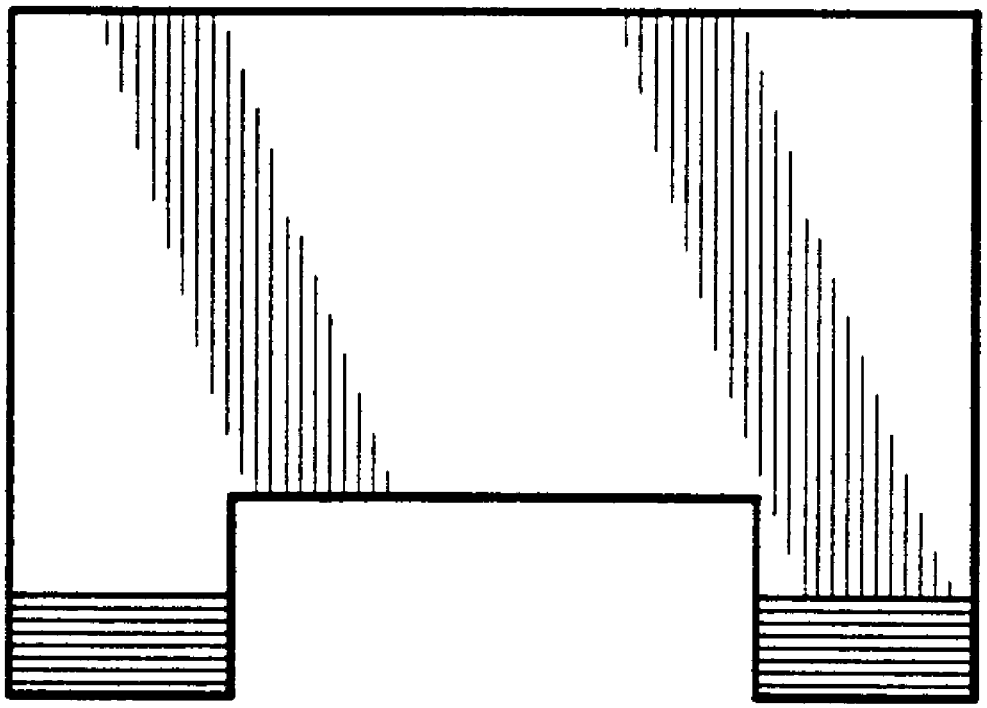
FIG. 1 illustrates a conventional surface mount component with metallized terminals.
Figure 3:
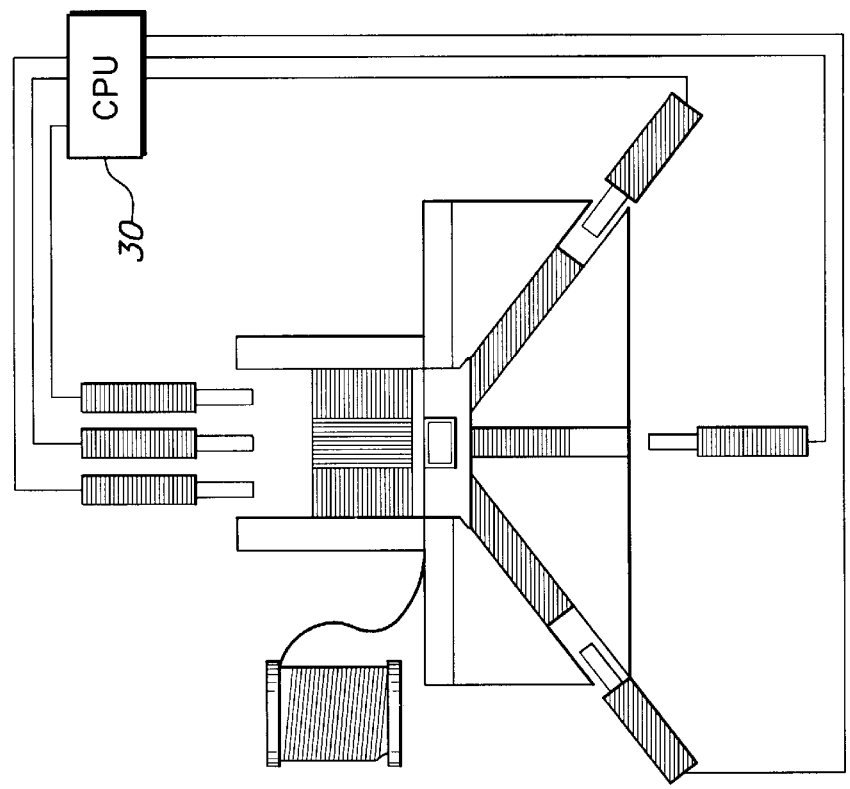
FIG. 3 illustrates the mechanical platform with the terminal wire uncoiled and positioned for attachment to the core material.

In operation, the core material 15 is first suspended in the mechanical platform 10 in the feeding direction. The core material is processed in the first processing station A, such as a notching station or other pre-terminal application station and is fed to the terminal forming station B. The conductive filament 18 is inserted in the opening 16 between the core material 15 and the first slide assembly 12 in a direction that is substantially perpendicular to the core feeding direction (FIGS. 2 and 3). The controller 30 then activates the plungers 22 of the first slide assembly 12 to drive the plungers 22 from the retracted position shown in FIG. 2 to the extended position shown in FIG. 4. In the extended position, the outermost plungers 22a deflect the filament 18 such that the filament 18 surrounds the upper perimeter of the core material 15, including the top surface and the side surfaces of the core material 15 in FIG. 4, and the central plunger 22b engages the filament 18 to hold the filament 18 in place while the outermost plungers 22a form the staple.

One of the outermost plungers 22a (left plunger in FIG. 4) has attached thereto a carbide or hardened steel insert 34 on the end thereof, which shears the conductive filament 18 as it is displaced to the extended position from the retracted position. The insert 34 is bonded to the plunger 22a in any suitable manner such as by welding or bronzing. Alternatively, this outermost plunger could be made entirely from a carbide or hardened steel. Surface treatment can be applied to this steel to improve its wear properties.

The second slide assembly 14 is next actuated by the controller 30 to drive the outermost plungers 24a of the second slide assembly 14 from their retracted position to their extended position as shown in FIG. 5, thereby shaping the conductive filament 18 across an underside of the core material 15. Subsequently, the central plunger 24b of the second slide assembly 14 is driven to its extended position to press the thus formed terminal as shown in FIG. 6. When the first and second slide assemblies 12, 14 are retracted, the terminal is complete (see FIG. 7).

By virtue of the structure and method according to the invention, terminals for a surface mount device can be easily manufactured without extensive processing or extraneous materials for processing. By using wire staples for the device terminals, readily available stock can be used such as tinned-copper bus wire. Moreover, the terminal lead material can be spooled and dispensed during assembly. Tinned-copper wire is easily soldered, making it an ideal material for terminal leads. Using heat and pressure, inductor windings or fuse filaments or the like can be readily tacked to the staple-terminal to maintain a good electrical contact with strong mechanical stability. No additional adhesives are required. In addition, the wire staples provide additional elevation above the printed circuit board (PCB) surface, which, in turn, enhances electrical performance by reducing PCB coupling losses. Finally, the staple configuration provides a well on the top of the surface mount device, which is suitable for coating material for automated placement machines, and an external mold is not required to form a uniform surface area.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. An apparatus for forming terminals on a core of a surface mount device, the apparatus comprising:
    a mechanical platform supporting a core material in a core feeding direction, said mechanical platform including an opening adapted to receive a conductive filament, said opening supporting the conductive filament adjacent the core material in a direction substantially perpendicular to the core feeding direction;
    a first slide assembly coupled with said mechanical platform, said first slide assembly being displaceable between a retracted position spaced from the core material and an extended position surrounding the core material; and
    a second slide assembly coupled with said mechanical platform, said second slide assembly being displaceable between a retracted position spaced from the core material and an extended position engaging the core material.

2. An apparatus according to claim 1, wherein said first slide assembly comprises a plurality of plungers displaceable between the retracted position and the extended position, an outermost pair of said first slide plungers being disposed on opposite sides of the core material in the extended position.

3. An apparatus according to claim 2, wherein said plungers comprise one of air pressure actuated plungers, solenoid actuated plungers and cam actuated plungers.

4. An apparatus according to claim 2, wherein said second slide assembly comprises a plurality of plungers displaceable between the retracted position and the extended position, said plurality of plungers engaging the core material in the extended position.

5. An apparatus according to claim 4, wherein said plungers comprise one of air actuated plungers, solenoid actuated plungers and cam actuated plungers.

6. An apparatus according to claim 4, wherein in the extended position, said second slide plungers engage said conductive filament and shape said conductive filament across an underside of the core material.

7. An apparatus according to claim 6, wherein said second slide assembly comprises at least three plungers, the outermost pair of said second slide plungers engaging said conductive filament in the extended position and shaping said conductive filament across the underside of the core material, and a central plunger engaging said conductive filament and pressing said shaped conductive filament against the core material in the extended position.

8. An apparatus according to claim 2, wherein in the extended position, said outermost pair of said first slide plungers engage said conductive filament and shape said conductive filament about an upper perimeter of the core material.

9. An apparatus according to claim 8, wherein in the extended position, a central plunger of said first slide plungers engages said conductive filament and secures said conductive filament in place while said outermost pair of said first slide plungers engage said conductive filament.

10. An apparatus according to claim 2, further comprising a shearing insert attached to one of said first slide plungers, said shearing insert shearing said conductive filament when said one of said plungers is displaced to the extended position.

11. An apparatus according to claim 2, wherein one of said first slide plungers is composed entirely of carbide or hardened steel, said one of said first slide plungers shearing the conductive filament when displaced to the extended position.

12. An apparatus according to claim 1, wherein in the extended position, said first slide assembly engages said conductive filament and shapes said conductive filament about an upper perimeter of the core material.

13. An apparatus according to claim 12, wherein in the extended position, said second slide assembly engages said conductive filament and shapes said conductive filament across an underside of the core material.

14. An apparatus according to claim 1, further comprising a controller communicating with said first slide assembly and said second slide assembly, said controller controlling a position of said first and second slide assemblies in accordance with predetermined operating parameters.

15. A method for forming terminals on a core of a surface mount device with a crimping apparatus, the apparatus including a mechanical platform adapted to support a core material and having an opening adapted to receive a conductive filament, the opening supporting the conductive filament adjacent the core material, a first slide assembly coupled with the mechanical platform and displaceable between a retracted position spaced from the core material and an extended position surrounding the core material, and a second slide assembly coupled with the mechanical platform and displaceable between a retracted position spaced from the core material and an extended position engaging the core material, the method comprising:

(a) suspending the core material in the mechanical platform in the core feeding direction;

(b) inserting the conductive filament between the core material and the first slide assembly in the opening, the conductive filament being inserted in a direction substantially perpendicular to the core feeding direction;

(c) displacing the first slide assembly from the retracted position to the extended position, thereby shaping the conductive filament about an upper perimeter of the core material; and (d) displacing the second slide assembly from the retracted position to the extended position, thereby shaping the conductive filament across an underside of the core material.

16. A method according to claim 15, wherein step (c) comprises the step of shearing the conductive filament at a predetermined length.

17. A method according to claim 15, wherein steps (c) and (d) are performed in succession.

18. A method according to claim 15, wherein the apparatus further includes a controller that controls the first and second slide assemblies, and wherein steps (c) and (d) are practiced by controlling a position of the first and second slide assemblies with the controller.

19. A method according to claim 15, wherein the first slide assembly includes a plurality of plungers, an outermost pair of which being disposed on opposite sides of the core material in the extended position, and wherein step (c) comprises the step of displacing the outermost pair of plungers from the retracted position to the extended position.

20. A method according to claim 19, wherein the first slide assembly further includes a central plunger disposed between the outermost pair of plungers, and wherein step (c) further comprises the step of securing the filament adjacent the core material with the first slide central plunger displaced to the extended position.

21. A method according to claim 19, wherein the second slide assembly includes a plurality of plungers and wherein step (d) comprises the step of displacing an outermost pair of the second slide plungers from the retracted position to the extended position.

22. A method according to claim 21, wherein the second slide assembly further includes a central plunger disposed between the outermost plungers and wherein step (d) further comprises the step of pressing the filament to the underside of the core material with the second slide central plunger displaced to the extended position.

23. An apparatus for forming terminals on a core of a surface mount device, the apparatus comprising:

means for supporting a core material in a core feeding direction, said supporting means adapted to receive a conductive filament disposed adjacent the core material in a direction substantially perpendicular to the core feeding direction;

first deflecting means for deflecting the conductive filament about an upper perimeter of the core material; and second deflecting means for deflecting the conductive filament across an underside of the core material.

24. An apparatus according to claim 23, wherein said first deflecting means comprises means for securing the conductive filament while the conductive filament is being deflected about the upper perimeter of the core material.

25. An apparatus according to claim 23, wherein said second deflecting means comprises means for pressing the conductive filament against the underside of the core material.

26. An apparatus according to claim 23, further comprising control means for controlling a position of the first deflecting means and the second deflecting means in accordance with predetermined operating parameters.

\* \* \* \* \*